United States Patent
Cara et al.

(10) Patent No.: US 7,301,251 B2
(45) Date of Patent: Nov. 27, 2007

(54) ACTUATOR EQUIPPED WITH AN ELECTRONIC CARD WITH AN ARRANGEMENT FOR LIMITING ELECTROMAGNETIC RADIATIONS

(75) Inventors: Hervé Cara, Bobigny Cedex (FR); Stéphane Delabriere, Bobigny Cedex (FR)

(73) Assignee: Valeo Vision, Bobigny (FR)

( * ) Notice: Subject to any disclaimer, the term of this patent is extended or adjusted under 35 U.S.C. 154(b) by 0 days.

(21) Appl. No.: 10/853,818

(22) Filed: May 26, 2004

(65) Prior Publication Data
US 2005/0023904 A1      Feb. 3, 2005

(30) Foreign Application Priority Data
May 26, 2003    (FR) .................... 03 06355

(51) Int. Cl.
*H02K 7/00* (2006.01)

(52) U.S. Cl. .................. 310/71; 362/286; 362/513; 439/95; 361/753

(58) Field of Classification Search ............ 310/71, 310/89, 12–37, 47, 50; 362/513, 286; 361/748, 361/752, 753; 439/95
See application file for complete search history.

(56) References Cited

U.S. PATENT DOCUMENTS

| | | | |
|---|---|---|---|
| 4,728,835 A * | 3/1988 | Baines | 310/71 |
| 4,853,568 A * | 8/1989 | Fujiwara | 310/68 C |
| 5,206,571 A * | 4/1993 | Burri | 318/685 |
| 5,251,114 A * | 10/1993 | Cantin et al. | 362/286 |
| 5,321,589 A * | 6/1994 | Shinkawa et al. | 362/524 |
| 5,673,991 A * | 10/1997 | Eickhoff et al. | 362/513 |
| 5,801,466 A * | 9/1998 | Odagiri et al. | 310/81 |
| 5,911,502 A * | 6/1999 | Zillgitt et al. | 362/508 |
| 5,943,214 A * | 8/1999 | Sato et al. | 361/752 |
| 5,986,367 A * | 11/1999 | Tsuzaki et al. | 310/71 |
| 6,232,684 B1 * | 5/2001 | Haag et al. | 310/68 R |
| 6,390,657 B1 | 5/2002 | Billott | 362/519 |
| 6,528,915 B1 * | 3/2003 | Moskob | 310/71 |
| 6,542,381 B1 * | 4/2003 | Sei et al. | 361/801 |
| 6,544,047 B2 * | 4/2003 | Moore | 439/95 |
| 6,740,999 B1 * | 5/2004 | Segawa | 310/81 |
| 2002/0098726 A1 | 7/2002 | Deguchi | 439/92 |
| 2002/0118517 A1 | 8/2002 | Giles et al. | 361/738 |

FOREIGN PATENT DOCUMENTS

| | | | |
|---|---|---|---|
| JP | 08-140301 | * | 5/1996 |
| JP | 10-117460 | * | 5/1998 |

OTHER PUBLICATIONS

French Search Report dated Jan. 8, 2004.

* cited by examiner

*Primary Examiner*—Dang Le
(74) *Attorney, Agent, or Firm*—Morgan & Finnegan, LLP

(57) ABSTRACT

The invention concerns an actuator. In a common housing are a motor contained in a metallic casing and an electronic card adapted to control the motor. The casing is electrically connected to a ground. This connection is made by a deformable element, whose deformation provides, by contact, the electrical connection between the casing and the ground.

5 Claims, 3 Drawing Sheets

ACTUATOR EQUIPPED WITH AN ELECTRONIC CARD WITH AN ARRANGEMENT FOR LIMITING ELECTROMAGNETIC RADIATIONS

The present invention concerns an actuator equipped with an electronic card with an arrangement for limiting electromagnetic radiations. It applies in particular to an actuator intended to actuate a motor vehicle headlight reflector.

High-frequency electromagnetic signals are generated during the functioning of an electronic circuit for example containing a high-frequency oscillator. These signals are produced during the normal functioning of an electrical circuit and are undesirable since they may interfere with the normal functioning of another electrical circuit. This interference and its harmful effects are well known to users of electronic equipment.

In order to minimize these undesirable signals, it is known how to shield portions of the electronic circuit in question with a conductive screen at a low potential or at earth potential. This grounded electromagnetic screen absorbs the electromagnetic field. Thus, in the case of an electronic card, it is known how to weld electromagnetic shielding to the grounding track of the card formed on the electronic card. However, such an arrangement makes inspection or repair of the card practically impossible.

Moreover, in a particular application concerning a motor vehicle headlight reflector actuator, a known arrangement consists of mounting, in a common housing, a stepping motor and an electronic control card. In order to allow mounting and removal of this card, the latter is mounted on runners arranged on the card close to the motor, by insertion of the drawer type.

Controlling a stepping motor, for example with two phases, causes in normal mode strong electromagnetic interference referred to as EMC (Electromagnetic Compatibility) because of the cutting off of the voltage and power supply.

It is known how to use the casing of the motor as grounded shielding. This grounding is carried out by an electric wire known as the 5th wire, mounted on the electronic card side on a card connector comprising a connection to the grounding track and on the motor side on a connection connected by a crimped tongue to the casing. This connection on the motor side also carries the tour signal transmission connections necessary for the control.

This solution poses the following technical problems.

It assumes first of all the presence of a connector on the electronic card side carrying a connection to the grounding track.

And in particular the so-called five-wire connection on the motor is a specific arrangement of the motor. In other words, a standard four-phase stepping motor comprises a four-wire connection without electrical connection to the casing and, in the case of a standard motor mounting, this solution cannot be envisaged.

In more general terms, whatever the standard motor without connector with electrical connection to the casing, this solution cannot be applied.

However, the requirements of electromagnetic compatibility become more and more important in this type of equipment.

To resolve this problem, the invention proposes an actuator comprising, in a common housing, a motor contained in a metallic casing and an electronic card controlling this motor, the casing being electrically connected to ground, wherein this connection is made by means of at least one element, including at least one conducting deformable element, whose deformation provides by contact the electrical connection between the casing and the ground. The most simple embodiment consists at the electrical connection between the casing and the ground being provided solely by a deformable and electrically conductive element. However, it is also possible to have an electrical connection provided by a plurality of conductive elements amongst which there is at least one deformable element. This is particularly useful when the configuration of the product is such that the deformable element is too distant from the motor casing. It is then necessary to provide electrical continuity in an appropriate fashion between the casing and the ground with the arrangement of ad hoc conducive elements.

The arrangement according to the invention makes it possible to obtain good efficacy of electromagnetic compatibility, whilst being able to be adapted to any type of motor and any type of electronic control card.

The invention also has the following advantages.

Another effect of the functioning of an electrical circuit is the thermal energy. If it is not dissipated, the rise in heat may give rise to faulty functioning of the electronic card and may even damage the card components. The conductive deformable element provides electromagnetic compatibility whilst ensuring a heat drain favorable to heat dissipation.

On the other hand, using this shielding makes it possible to work with faster cutoff edges and thus to minimize losses on switching. This optimization of the heat size facilitates the reduction in the size of the motor driver component housing and therefore influences the cost of the housing.

In addition it is important to preserve a reduced bulk of the motor and electronic card assembly. The invention makes it possible to obtain or preserve optimum size of the actuator housing and therefore excellent integration.

According to a preferred embodiment, the deformable element is fixed to the grounding track of the electronic card.

The deformable element preferably comprises at least one flexible tongue. Advantageously it consists of a single tongue.

The invention applies particularly to such an actuator whose electronic control card is put in place close to the motor on runners fixed to the housing by a fitting of the drawer type wherein the card carries the flexible conductive tongue fixed to its grounding track, the tongue being conformed so as to come into contact with deformation on the casing of the motor by fitting of the card in the runners.

According to a preferred embodiment, the tongue has a Z-shaped profile whose bottom leg is fixed to the grounding track.

The top leg of the tongue coming into contact with the motor casing is preferably provided with at least one longitudinal slot in order to absorb the positioning stresses relating to the tongue with respect to the motor contact area.

A flat area is provided for the gripping of the tongue by CMS component placing machines in automatic mode. The packaging of the tongue is in strip form compatible with automatic placing lines.

The tongue is advantageously welded to the grounding track of the electronic card.

The preferred application of the invention is such an actuator intended to actuate a motor vehicle headlight reflector.

The invention is described below in more detail with the help of figures which depict only one preferred embodiment of the invention.

Figure 1:
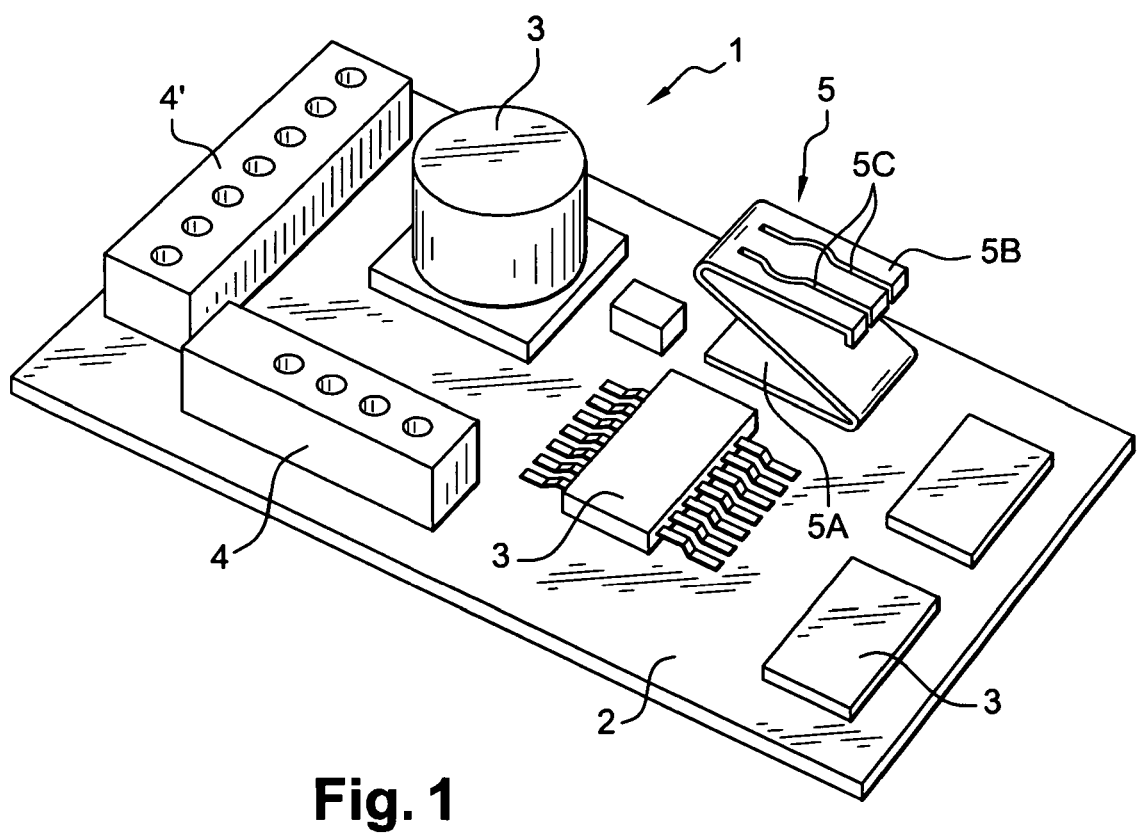
FIG. 1 is a perspective view of an electronic control card according to the invention.

An electronic card 1 as depicted in FIG. 1 comprises in a known fashion an insulating substrate 2 provided with conductive tracks, not shown, connecting various electronic components 3, as well as two connectors 4, 4'. This card 1 comprises an grounding track to which there is fixed, preferably by soldering, a deformable conductive element 5 consisting of a conductive flexible tongue.

This tongue 5 has a Z-shaped profile, the bottom leg 5A of which is soldered to the grounding track and the top leg 5B of which is provided with at least one longitudinal slot 5C, here precisely two slots 5C, the function of which will be explained below.

Figure 2:
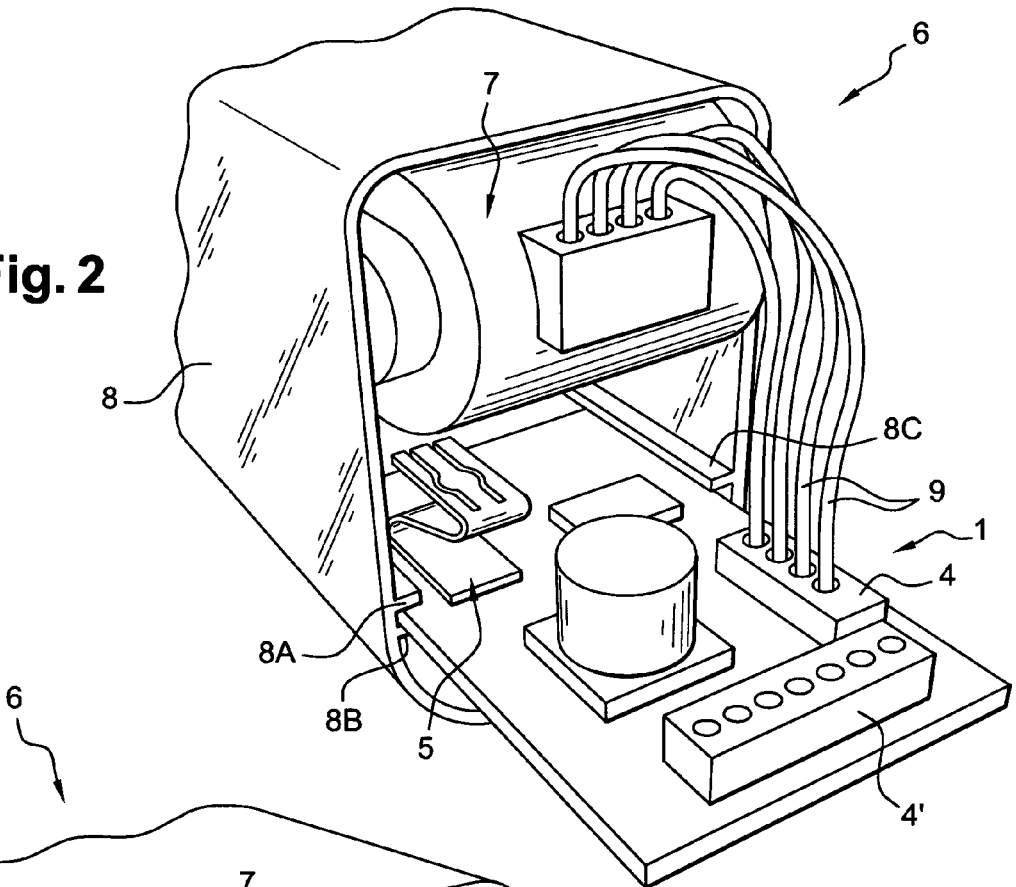
FIGS. 2 and 3 are partial perspective views of an actuator according to the invention, when the electronic control card is mounted.
Figure 3:
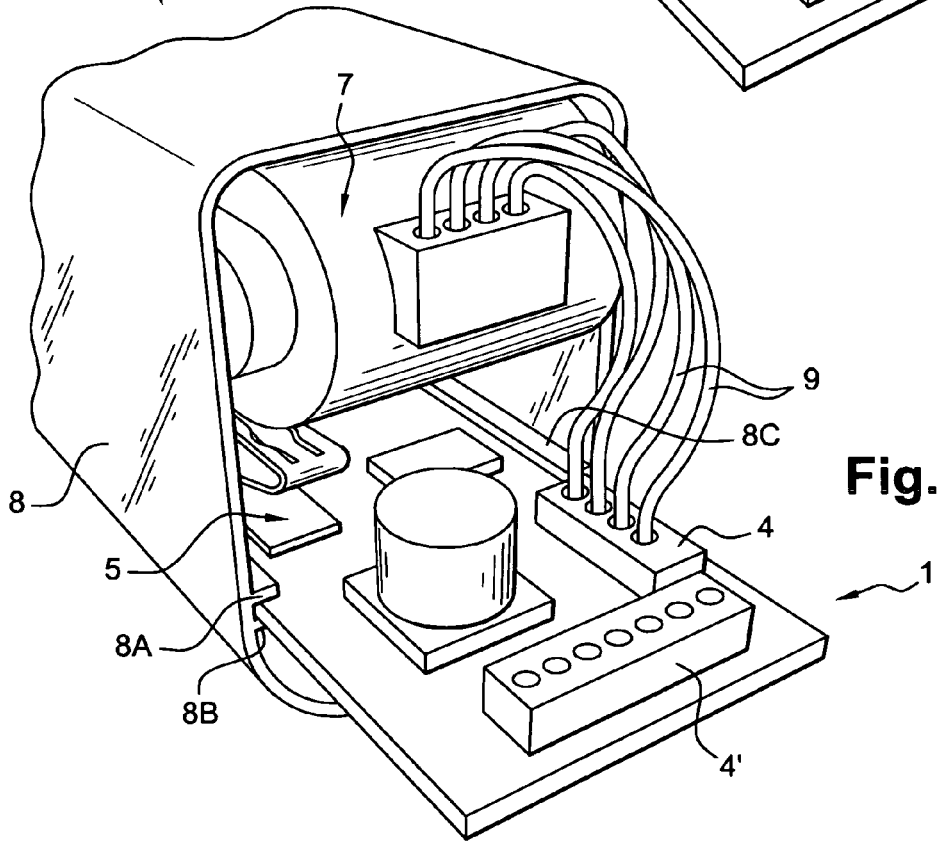

An electronic card of this type is intended for an actuator 6 depicted partly in FIGS. 2 and 3. Such an actuator is intended to actuate a motor vehicle headlight reflector.

This actuator comprises, in a common housing 8, a motor contained in a metallic casing 7 and such an electronic card 1 controlling this motor fitted close to the motor 7 on runners 8A, 8B, 8C fixed to the housing 8 by a fitting of the drawer type. The card 1 is put in place with its connector 4 intended for the control connection with the motor directed towards the outside in order to allow the connection of four wires 9 controlling the motor, which is here a two-phase stepping motor.

When the card 1 is inserted on the runners, the top leg 5B of the tongue 5 is pushed downwards, seen according to the figures and therefore carries to be applied with a thrust force against the casing of the motor 7. Excellent contact is thus provided between the tongue 5 and the casing. The deformation of the tongue 5 provides by contact the electrical connection between the casing and the ground of the card 1.

The function of the slots 5C carried by this leg 5B appears in FIGS. 2 and 3. In general terms, the grounding track of the card 1 is close to one edge of the card. According to the relative arrangement of the various elements, having regard to the drawer shape, the leg 5B can be placed therefore on one edge of the casing of the motor 7 with only part in contact with the latter. By virtue of the arrangement of the slots 5C, only part of the leg 5B disposed between one edge of this arm and a slot 5C is deformed. Thus the deformation force is limited.

A preferred embodiment is described above but the invention concerns any equivalent embodiment.

The deformable Z-shaped tongue 5 can be in any other form, the aim being to provide by its deformation the electrical connection between the casing and the ground by contact.

Figure 4:
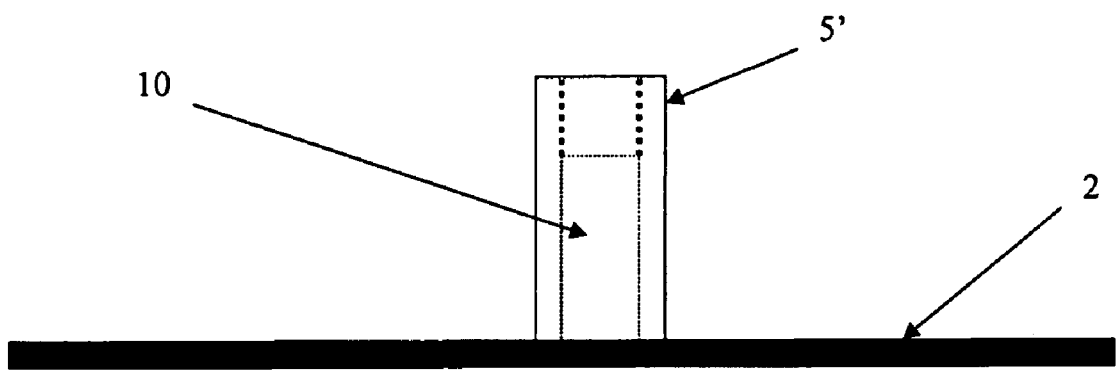
FIG. 4 is a cross-sectional view of a deformable element according to the invention.

This deformable element 5 can consist of a flexible tongue as precisely described. It can also consist of a connection contact with a spring 5' sliding in a stud 10 as shown in FIG. 4.

The function of this deformable element 5 is to provide the electrical connection of the casing to ground. According to the preferred embodiment, it is the grounding track of the electronic card which is chosen. It can also be envisaged disposing this contact element between the motor casing and the housing of the actuator.

Moreover, this deformable element 5 can be fixed to the electronic card as described in the preferred embodiment or fixed to the actuator housing, for example by overmoulding, or even to the motor casing.

The choice of the material is guided by the spring properties of the material and by its weldability (pre-tinning). By way of example, it is possible to use phosphor bronze, of the CuSn9P type in the S14 state with a thickness for example of approximately 0.2 mm.

The invention also relates to the headlight equipped with the actuator according to the invention, and to the motor vehicle equipped with this type of headlight.

The invention claimed is:

1. An actuator comprising, in a common housing:
   a motor contained in a metallic casing configured to actuate a motor vehicle headlight reflector;
   an electronic control card for the motor, the electronic control card comprising at least one ground and a connector adapted to provide a control connection with the motor; and
   a deformable element fixed to the ground of the electronic control card, the deformable element comprising at least one connection contact with a spring sliding in a stud,
   wherein deformation of the deformable element provides by contact an electrical ground connection between an exterior surface of the casing of the motor and the ground of the electronic control card separate from the control connection of the motor.

2. An actuator according to claim 1, wherein said grounding is affected by at least one other element.

3. An actuator according to claim 2, wherein the deformable element is fixed to a grounding track of the electronic control card.

4. An actuator according to claim 1, wherein the deformable element is fixed to a grounding track of the electronic control card.

5. An actuator according to claim 1, wherein the deformable element is disposed between the electronic control card and the motor.

* * * * *

UNITED STATES PATENT AND TRADEMARK OFFICE
CERTIFICATE OF CORRECTION

PATENT NO. : 7,301,251 B2  
APPLICATION NO. : 10/853818  
DATED : November 27, 2007  
INVENTOR(S) : Hervé Cara et al.

Page 1 of 1

It is certified that error appears in the above-identified patent and that said Letters Patent is hereby corrected as shown below:

At Column 1, line 44:

Please change "tour" to --four--.

At Column 2, line 13:

Please change "conducive" to --conductive--.

At Column 3, line 32:

Please change "carries" to --comes--.

Signed and Sealed this

Fifteenth Day of April, 2008

JON W. DUDAS  
*Director of the United States Patent and Trademark Office*